(12) United States Patent
Chung et al.

(10) Patent No.: US 10,916,473 B2
(45) Date of Patent: *Feb. 9, 2021

(54) METHOD OF CLEANING WAFER AFTER CMP

(71) Applicant: Taiwan Semiconductor Manufacturing Company, Ltd., Hsinchu (TW)

(72) Inventors: Chien-Hao Chung, Hsinchu (TW); Chang-Sheng Lin, Baoshan Township (TW); Kuo-Feng Huang, Tainan (TW); Li-Chieh Wu, Hsinchu (TW); Chun-Chieh Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/655,509

(22) Filed: Oct. 17, 2019

(65) Prior Publication Data
US 2020/0051855 A1    Feb. 13, 2020

Related U.S. Application Data

(60) Continuation of application No. 16/050,168, filed on Jul. 31, 2018, now Pat. No. 10,510,594, which is a
(Continued)

(51) Int. Cl.
*H01L 21/768* (2006.01)
*H01L 21/02* (2006.01)
(Continued)

(52) U.S. Cl.
CPC .. *H01L 21/76883* (2013.01); *H01L 21/02074* (2013.01); *H01L 21/76802* (2013.01);
(Continued)

(58) Field of Classification Search
CPC ......... H01L 21/76883; H01L 21/02074; H01L 23/535; H01L 21/76895; H01L 21/76802;
(Continued)

(56) References Cited

U.S. PATENT DOCUMENTS 5,893,756 A    4/1999  Berman et al.
5,935,871 A *  8/1999  Farkas .............. H01L 21/02074
                                                      134/2
(Continued)

FOREIGN PATENT DOCUMENTS

CN    105097470 A    11/2015
CN    105280591 A    1/2016
(Continued)

*Primary Examiner* — Syed I Gheyas
(74) *Attorney, Agent, or Firm* — Slater Matsil, LLP

(57) ABSTRACT

A method includes forming a first dielectric layer over a wafer, etching the first dielectric layer to form an opening, filling a tungsten-containing material into the opening, and performing a Chemical Mechanical Polish (CMP) on the wafer. After the CMP, a cleaning is performed on the wafer using a weak base solution.

19 Claims, 15 Drawing Sheets

Related U.S. Application Data division of application No. 15/395,057, filed on Dec. 30, 2016, now Pat. No. 10,109,523.

(60) Provisional application No. 62/427,336, filed on Nov. 29, 2016.

(51) Int. Cl.
*H01L 23/535* (2006.01)
*H01L 21/285* (2006.01)
*H01L 23/485* (2006.01)

(52) U.S. Cl.
CPC ...... *H01L 21/76895* (2013.01); *H01L 23/535* (2013.01); *H01L 21/28518* (2013.01); *H01L 21/76834* (2013.01); *H01L 21/76843* (2013.01); *H01L 21/76855* (2013.01); *H01L 23/485* (2013.01)

(58) Field of Classification Search
CPC ............. H01L 21/76843; H01L 23/485; H01L 21/76855; H01L 21/76834; H01L 21/28518; H01L 21/76877; H01L 21/76805; H01L 21/30625; H01L 21/02057

See application file for complete search history.

(56) References Cited

U.S. PATENT DOCUMENTS

| | | | |
|---|---|---|---|
| 6,451,697 | B1 | 9/2002 | Sun et al. |
| 6,498,131 | B1 | 12/2002 | Small et al. |
| 7,851,372 | B2 | 12/2010 | Kang et al. |
| 9,917,050 | B2 | 3/2018 | Chen et al. |
| 2004/0082275 | A1 | 4/2004 | Mahulikar et al. |
| 2005/0014667 | A1 | 1/2005 | Aoyama et al. |
| 2006/0160376 | A1 | 7/2006 | Padhi et al. |
| 2006/0284229 | A1* | 12/2006 | Park ............ H01L 21/76816 257/304 |
| 2008/0078420 | A1 | 4/2008 | Wen et al. |
| 2011/0204492 | A1 | 8/2011 | Xie et al. |
| 2011/0264360 | A1 | 10/2011 | Boss et al. |
| 2012/0306023 | A1 | 12/2012 | Ma et al. |
| 2013/0026578 | A1 | 1/2013 | Tsau |
| 2013/0040456 | A1 | 2/2013 | Eda et al. |
| 2013/0072411 | A1 | 3/2013 | Wojtczak et al. |
| 2015/0364371 | A1* | 12/2015 | Yen ............ H01L 21/76895 257/401 |
| 2016/0322468 | A1 | 11/2016 | Lu et al. |

FOREIGN PATENT DOCUMENTS

| | | |
|---|---|---|
| JP | 2011009556 A | 1/2011 |
| KR | 2017074003 A | 6/2017 |

\* cited by examiner

METHOD OF CLEANING WAFER AFTER CMP

PRIORITY CLAIM AND CROSS-REFERENCE

This application is a continuation of U.S. patent application Ser. No. 16/050,168, filed Jul. 31, 2018, and entitled "Method of Cleaning Wafer after CMP," which is a divisional of U.S. patent application Ser. No. 15/395,057, filed Dec. 30, 2016, and entitled "Method of Cleaning Wafer after CMP," now U.S. Pat. No. 10,109,523 issued Oct. 23, 2018, which claims the benefit of the U.S. Provisional Application No. 62/427,336, filed Nov. 29, 2016, and entitled "Method of Cleaning Wafer after CMP," which applications are hereby incorporated herein by reference.

BACKGROUND

In the manufacturing of integrated circuits, contact plugs are used for connecting to the source and drain regions and the gates of transistors. The source/drain contact plugs were typically connected to source/drain silicide regions, which are formed by forming contact openings to expose source/drain regions, depositing a metal layer, performing an anneal to react the metal layer with the source/drain regions, filling tungsten into the remaining contact opening, and performing a Chemical Mechanical Polish (CMP) to remove excess tungsten. A cleaning is then performed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
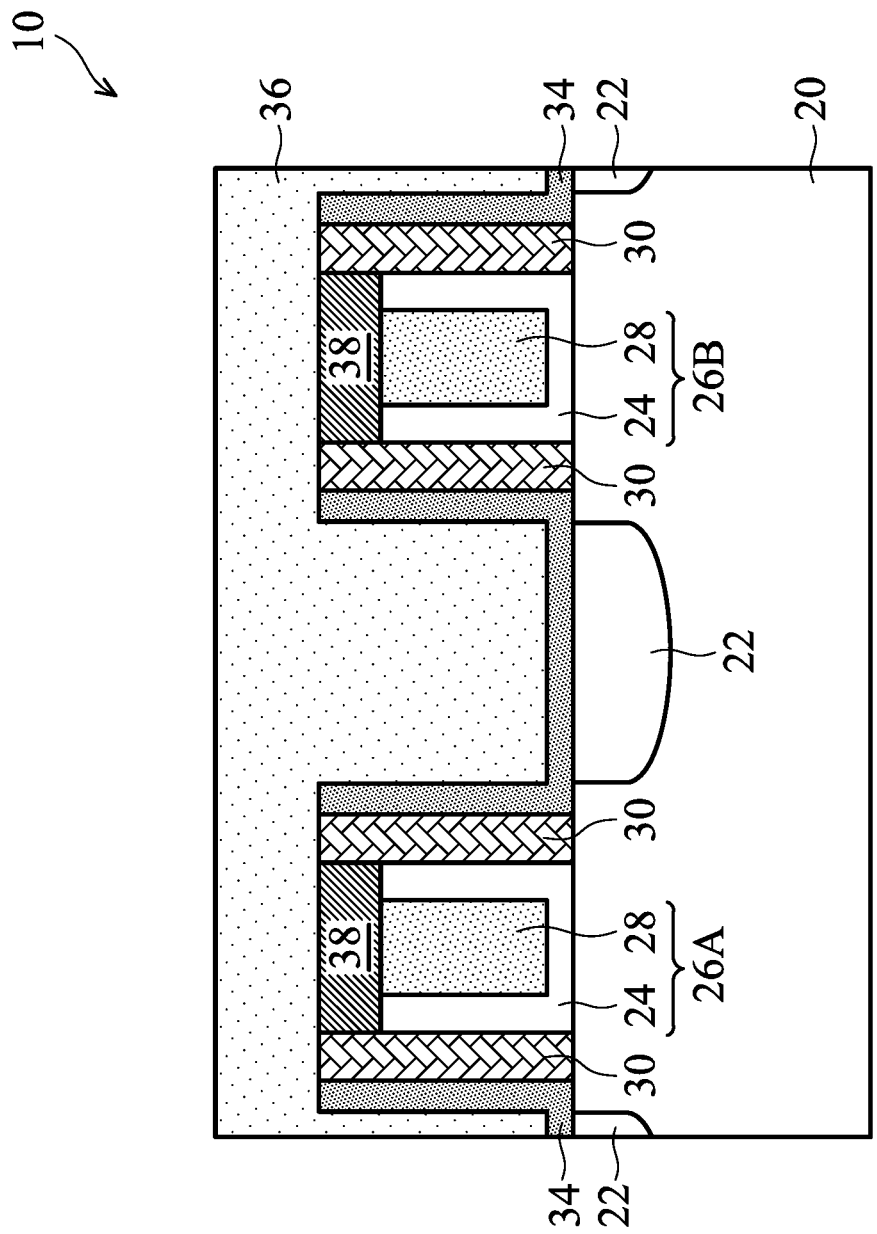
FIGS. 1 through 12 are cross-sectional views of intermediate stages in the formation of a transistor and contact plugs in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 15:
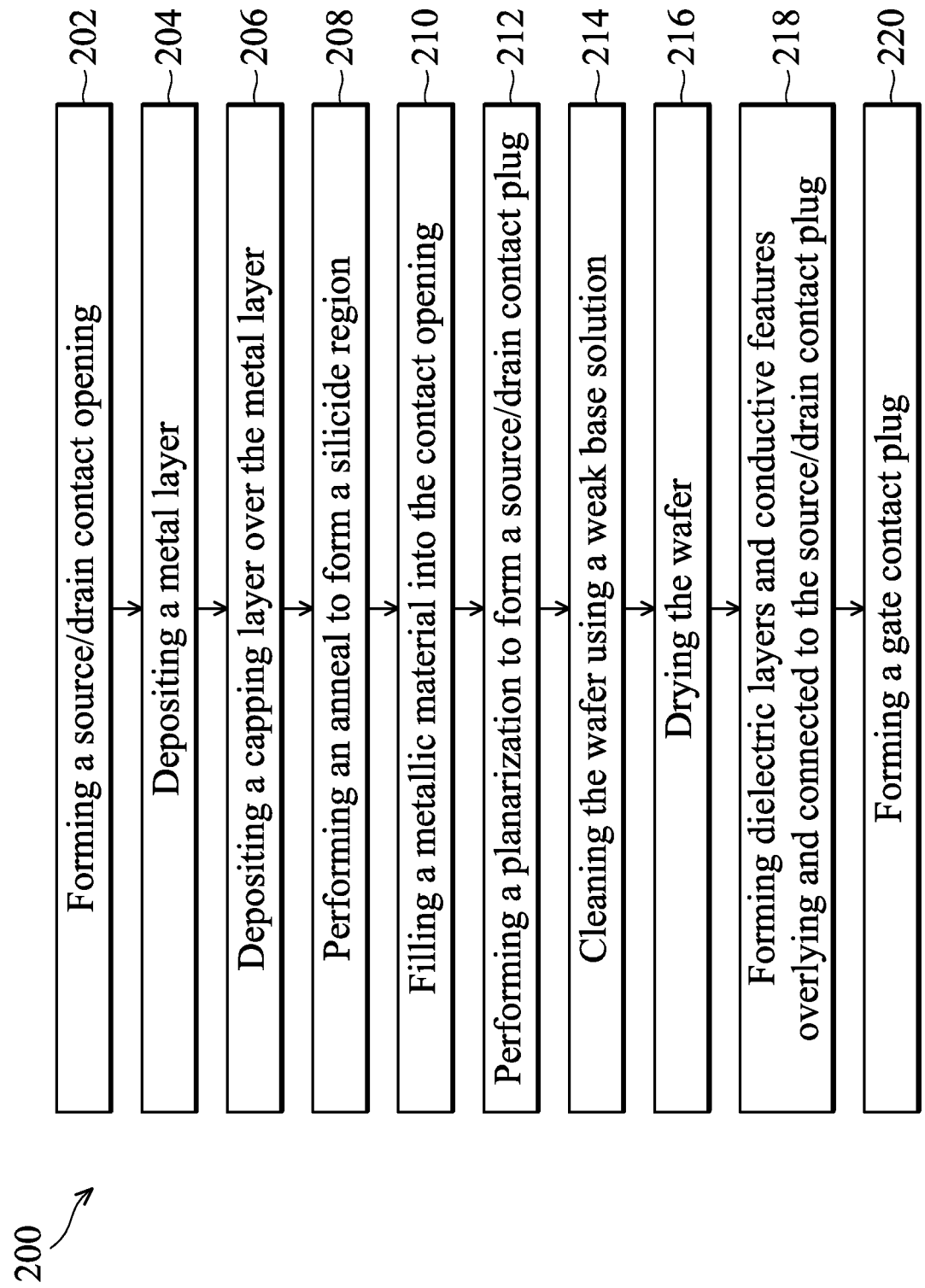
FIG. 15 illustrates a process flow for forming a transistor in accordance with some embodiments.

A transistor having contact plugs connected to silicide regions and the method of forming the same are provided in accordance with various exemplary embodiments. The intermediate stages of forming the transistor are illustrated. The variations of some embodiments are discussed. Throughout the various views and illustrative embodiments, like reference numbers are used to designate like elements. The steps shown in FIGS. 1 through 12 are also illustrated schematically in the process flow 200 as shown in FIG. 15.

FIGS. 1 through 12 are cross-sectional views of intermediate stages in the formation of a transistor and the respective contact plugs in accordance with some exemplary embodiments. Referring to FIG. 1, wafer 10 is provided. Wafer 10 includes substrate 20, which may be formed of a semiconductor material such as silicon, silicon germanium, silicon carbon, a III-V compound semiconductor material, or the like. Substrate 20 may be a bulk substrate or a Semiconductor-On-Insulator (SOI) substrate.

Gate stacks 26A and 26B, which are collectively referred to as gate stacks 26, are formed over substrate 20. In accordance with some embodiments of the present disclosure, gate stacks 26A and 26B are formed as gate stack strips (in a top view of wafer 10) having lengthwise directions parallel to each other, wherein the distance between gate stacks 26A and 26B is minimized. Each of gate stacks 26A and 26B may include gate dielectric 24, gate electrode 28 over gate dielectric 24, and hard mask 38 over gate electrode 28. In accordance with some embodiments of the present disclosure, gate stacks 26 are replacement gate stacks, which are formed by forming dummy gate stacks (not shown), removing the dummy gate stacks to form recesses, and forming the replacement gates in the recesses. As a result, each of gate dielectrics 24 includes a bottom portion underlying the respective gate electrode 28, and sidewall portions on the sidewalls of the respective gate electrode 28. The sidewall portions form rings encircling the respective gate electrodes 28.

Figure 2:
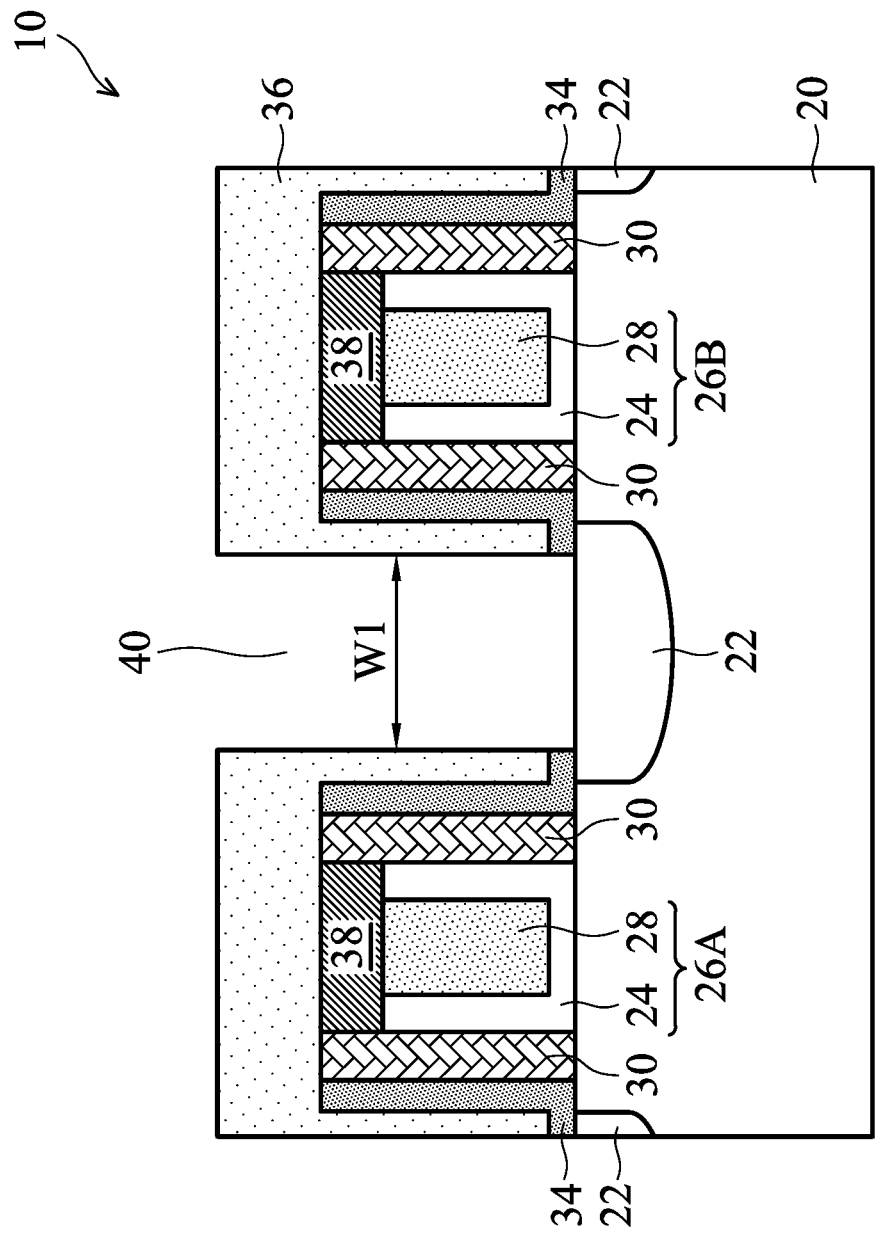

In accordance with some embodiments of the present disclosure, source and drain regions 22 (referred to as source/drain regions 22 hereinafter) are formed to extend into substrate 20. In accordance with alternative embodiments, source/drain regions 22 are formed after the formation of contact opening as shown in FIG. 2. One or more of source/drain regions 22 may be a common source region or a common drain region shared by gate stacks 26A and 26B. Accordingly, gate stack 26A may form a first transistor in combination with the source/drain regions 22 on the opposite sides of gate stack 26A, and gate stack 26B may form a second transistor in combination with the source/drain regions 22 on the opposite sides of gate stack 26B. The first transistor and the second transistor may be electrically connected in parallel to act as a single transistor.

Gate dielectric 24 may be a single layer or a composite layer that includes a plurality of layers. For example, gate dielectric 24 may include an interfacial oxide layer and a high-k dielectric layer over the oxide layer. The oxide layer may be a silicon oxide layer formed through thermal oxidation or chemical oxidation. The high-k dielectric layer may have a k value greater than 7, or even greater than 20. Exemplary high-k dielectric materials include hafnium oxide, zirconium oxide, lanthanum oxide, and the like.

In accordance with some embodiments of the present disclosure, each gate electrode 28 has a single-layer structure formed of a homogeneous conductive material. In accordance with alternative embodiments, each gate electrode 28 has a composite structure including a plurality of layers formed of TiN, TaSiN, WN, TiAl, TiAlN, TaC, TaN, aluminum, or alloys thereof. The formation of gate electrodes 28 may include Physical Vapor Deposition (PVD), Metal-Organic Chemical Vapor Deposition (MOCVD), and/or other applicable methods. Hard masks 38 may be formed of silicon nitride, for example.

In accordance with alternative embodiments of the present disclosure, rather than being replacement gate stacks, gate stacks 26A and 26B are formed by depositing a blanket gate dielectric layer and a blanket gate electrode layer (such as a polysilicon layer), and then patterning the blanket gate dielectric layer and the blanket gate electrode layer.

Referring again to FIG. 1, Contact Etch Stop Layer (CESL) 34 is formed to cover substrate 20, and may extend on the sidewalls of gate spacers 30. In accordance with some embodiments of the present disclosure, CESL 34 is formed of silicon nitride, silicon carbide, or other dielectric materials. Inter-Layer Dielectric (ILD) 36 is formed over CESL and gate stacks 26A and 26B. ILD 36 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like. The formation may include, for example, Chemical Vapor Deposition (CVD), Flowable CVD (FCVD), spin-on coating, or the like.

Referring to FIG. 2, ILD 36 and CESL 34 are etched to form contact opening 40. The respective step is illustrated as step 202 in the process flow shown in FIG. 15. Opening 40 is a source/drain contact opening in accordance with some embodiments. Source/drain region 22 (if already formed) is exposed to contact opening 40. In accordance with some embodiments of the present disclosure, opening 40 has width W1 smaller than about 40 nm. Depth D1 may be greater than about 45 nm.

In accordance with some embodiments in which source/drain regions 22 have not been formed yet at this time, a Pre-Amorphization Implantation (PAI) and a source/drain implantation may be performed to form source/drain regions 22, wherein the species of the PAI and the implanted impurity for forming source/drain regions 22 are implanted into substrate 20 through opening 40. The PAI may be performed using germanium, silicon, or the like, which destroys the lattice structure of the implanted regions in order to control the depth of the subsequent source/drain implantation. The source/drain implantation may be performed using boron or indium if the respective transistor is a p-type transistor, or using phosphorous, arsenic, or antimony if the respective transistor is an n-type transistor.

Figure 3:
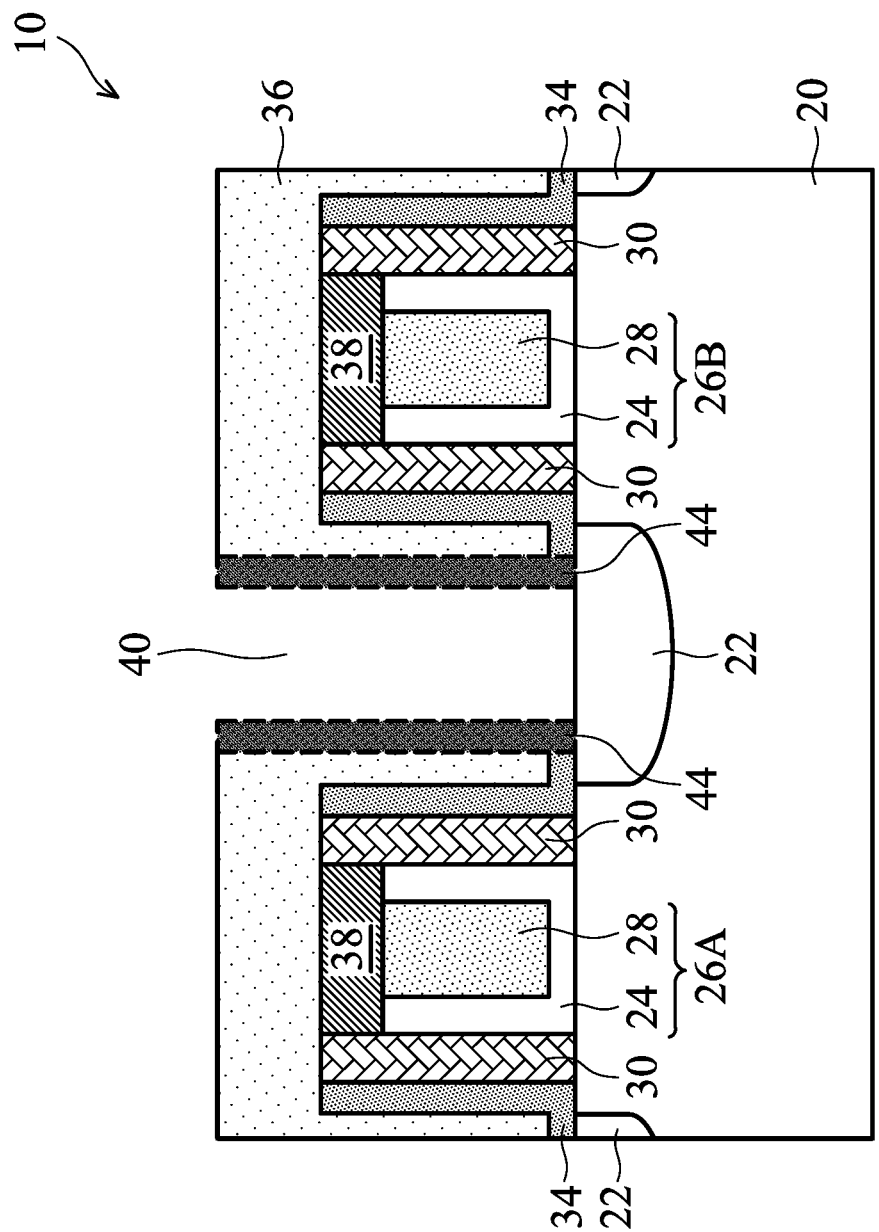

FIG. 3 illustrates the formation of contact (plug) spacers 44 in accordance with some embodiments of the present disclosure. The formation of contact spacers 44 may include depositing one or a plurality of conformal dielectric layer(s). The dielectric layer extend into contact opening 40, and includes vertical portions on the sidewalls of ILD 36, and horizontal portions at the bottom of opening 40 as well as over ILD 36. The deposition process is performed using a conformal deposition process such as Atomic Layer Deposition (ALD), CVD, or the like, so that the horizontal portions and vertical portions of the deposited layer have similar thicknesses. An anisotropic etching is then performed to remove the horizontal portions, leaving the vertical portions as contact spacers 44. The anisotropic etching may be performed using ammonia ($NH_3$) and $NF_3$ as etching gases. It is noted that contact spacers 44 in the same opening 40, when viewed in a top view of wafer 10, are portions of an integrated spacer ring.

In accordance with some embodiments of the present disclosure, spacers 44 are formed of a dielectric material that has a high etching selectivity relative to oxide, so that in subsequent cleaning processes (in which oxides are removed), the spacers are not damaged. For example, contact spacers 44 may be formed of silicon nitride, silicon oxy-carbide, silicon oxynitride, or the like.

In accordance with alternative embodiments of the present disclosure, spacers 44 are not formed. Accordingly, spacers 44 are illustrated using dashed lines to indicate this step may be performed or skipped. In accordance with these embodiments, the subsequently formed metal layer 46 (FIG. 4) may have sidewall portions in contact with the sidewalls of ILD 36.

Figure 4:
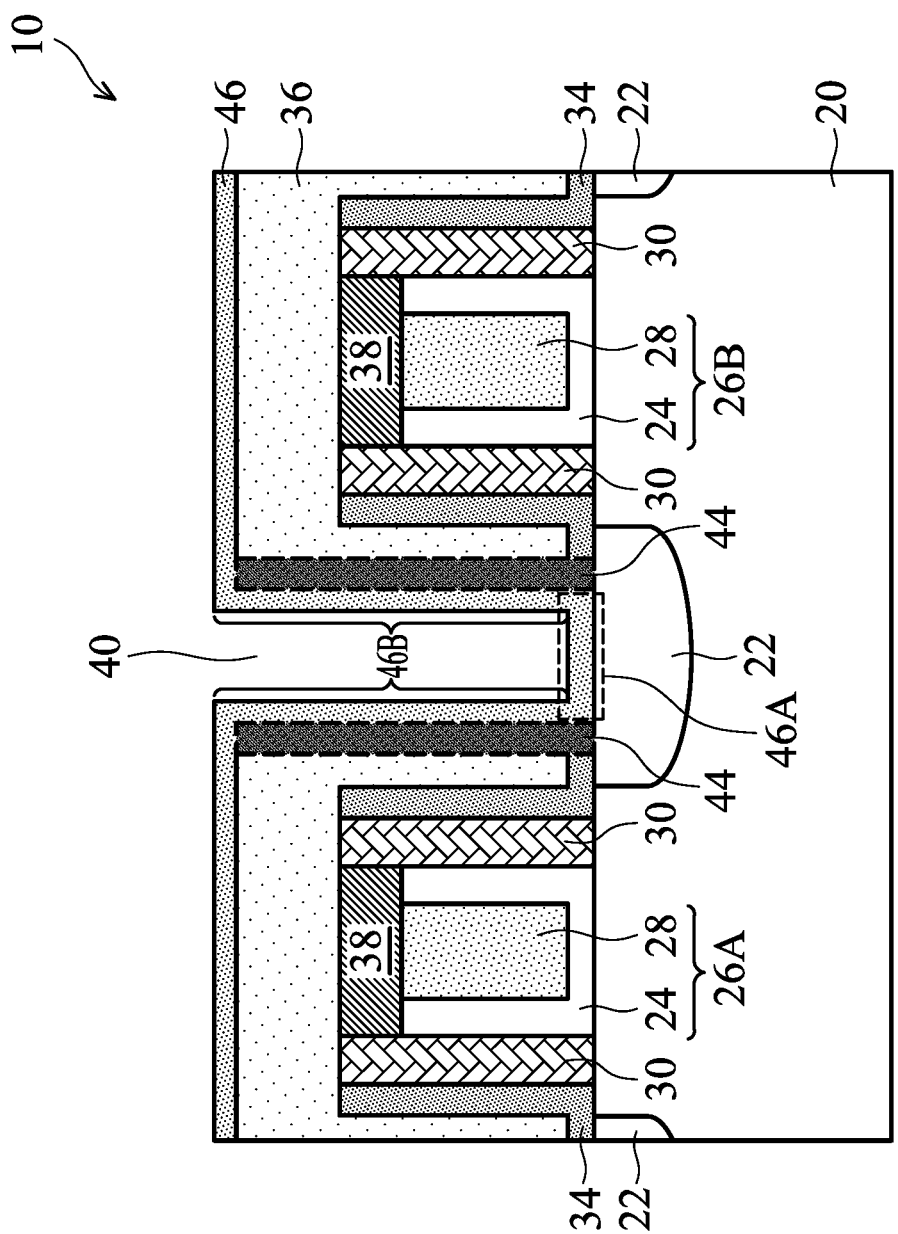

Next, referring to FIG. 4, metal layer 46 is deposited. The respective step is illustrated as step 204 in the process flow shown in FIG. 15. In accordance with some embodiments of the present disclosure, metal layer 46 is a titanium (Ti) layer, which may be formed using Physical Vapor Deposition (PVD). Metal layer 46 includes bottom portion 46A at the bottom of opening 40, and sidewall portions 46B on the sidewall surfaces of ILD 36. Metal layer 46 has two functions. The first function is that the bottom portion of metal layer 46 reacts with the underlying source/drain region 22 to form a source/drain silicide region. The second function is that metal layer 46 acts as an adhesion layer for the subsequently formed capping/adhesion layer.

Figure 5:
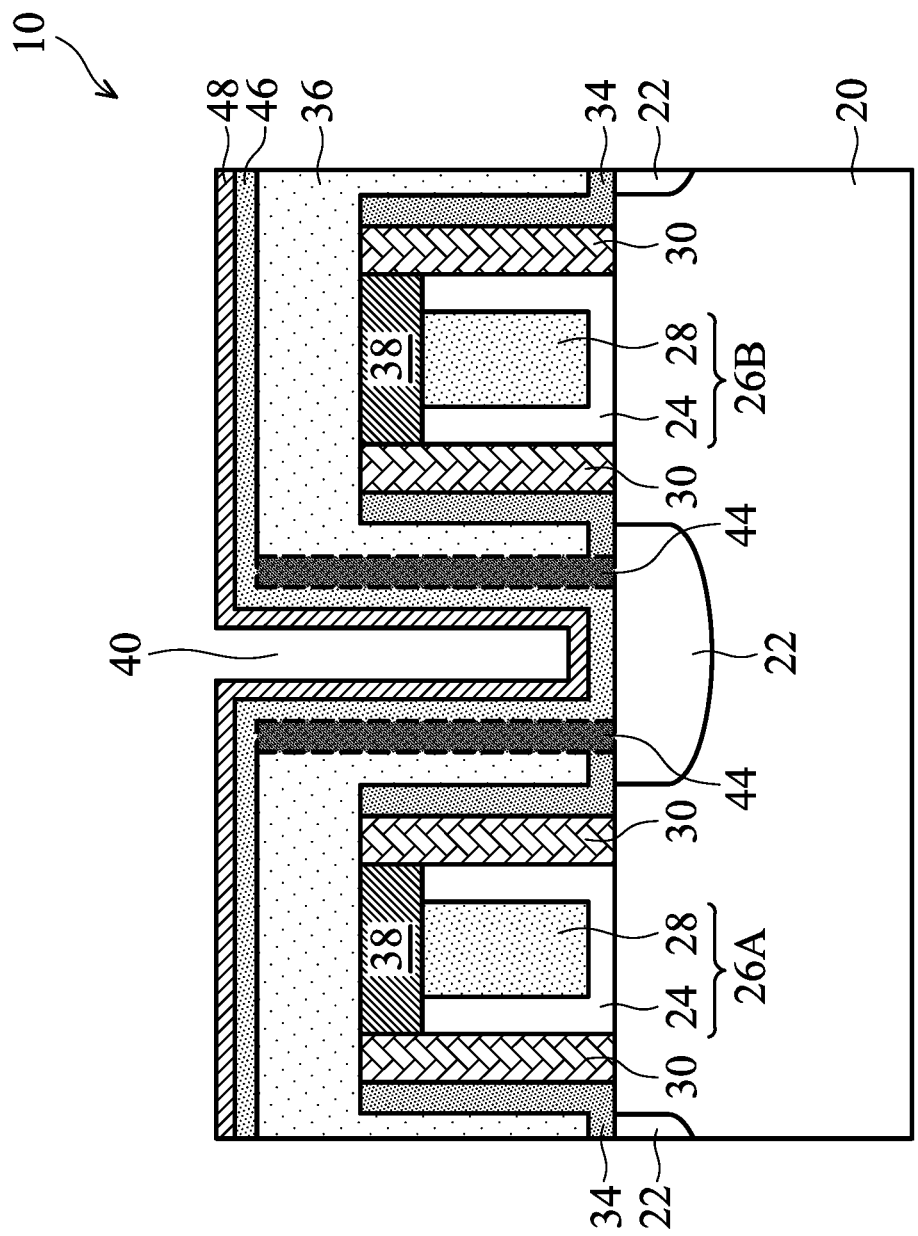

Referring to FIG. 5, capping layer 48 is deposited. The respective step is illustrated as step 206 in the process flow shown in FIG. 15. Capping layer 48 also acts as a diffusion barrier layer. In accordance with some embodiments of the present disclosure, capping layer 48 is formed of a metal nitride such as titanium nitride. Capping layer 48 may be formed using PVD, CVD, or the like.

Figure 6:
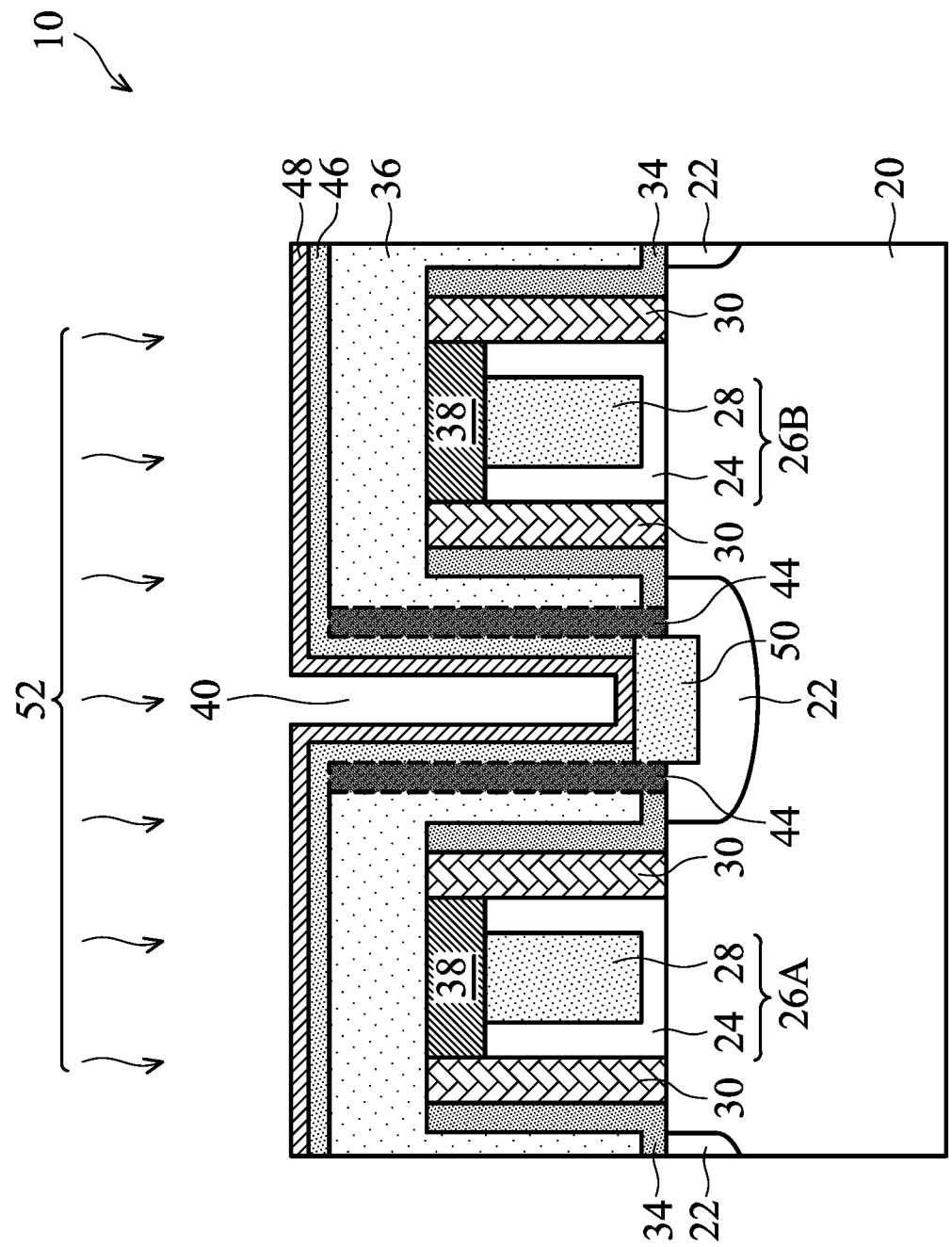

FIG. 6 illustrates a silicidation process for forming silicide region 50. In accordance with some embodiments of the present disclosure, the silicidation process is performed through an anneal, which is represented by arrows 52. The respective step is illustrated as step 208 in the process flow shown in FIG. 15. The anneal may be performed through Rapid Thermal Anneal (RTA), furnace anneal, or the like. Accordingly, the bottom portion of metal layer 46 reacts with source/drain region 22 to form silicide region 50. The sidewall portions of metal layer 46 remain after the silicidation process, as shown in FIG. 6. In accordance with some embodiments of the present disclosure, the bottom portion of metal layer 46 is fully reacted, and the top surface of silicide region 50 is in contact with the bottom surface of capping layer 48.

Figure 7:
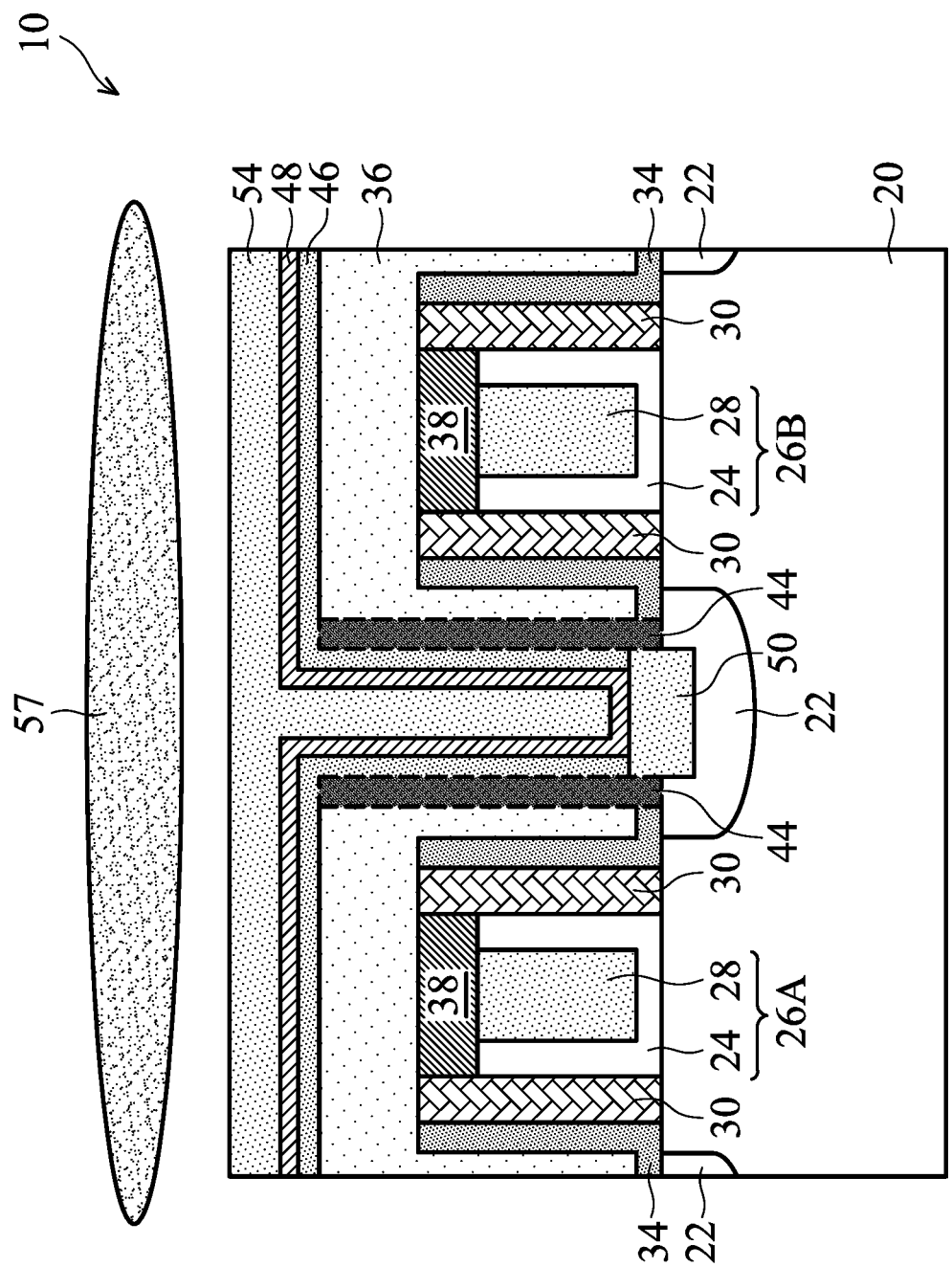

Next, metallic material 54 is filled into the remaining contact opening 40, and the resulting wafer 10 is shown in FIG. 7. The respective step is illustrated as step 210 in the process flow shown in FIG. 15. Metallic material 54 may be formed of a tungsten-containing material, which may be formed of pure or substantially pure tungsten (for example, with an atomic percentage greater than about 95 percent). In accordance with alternative embodiments of the present disclosure, metallic material 54 comprises titanium. Metallic material 54 is free from copper, cobalt, or the like since these materials will not benefit from the embodiments of the present disclosure due to different behaviors than tungsten in the subsequent process steps.

Figure 8:
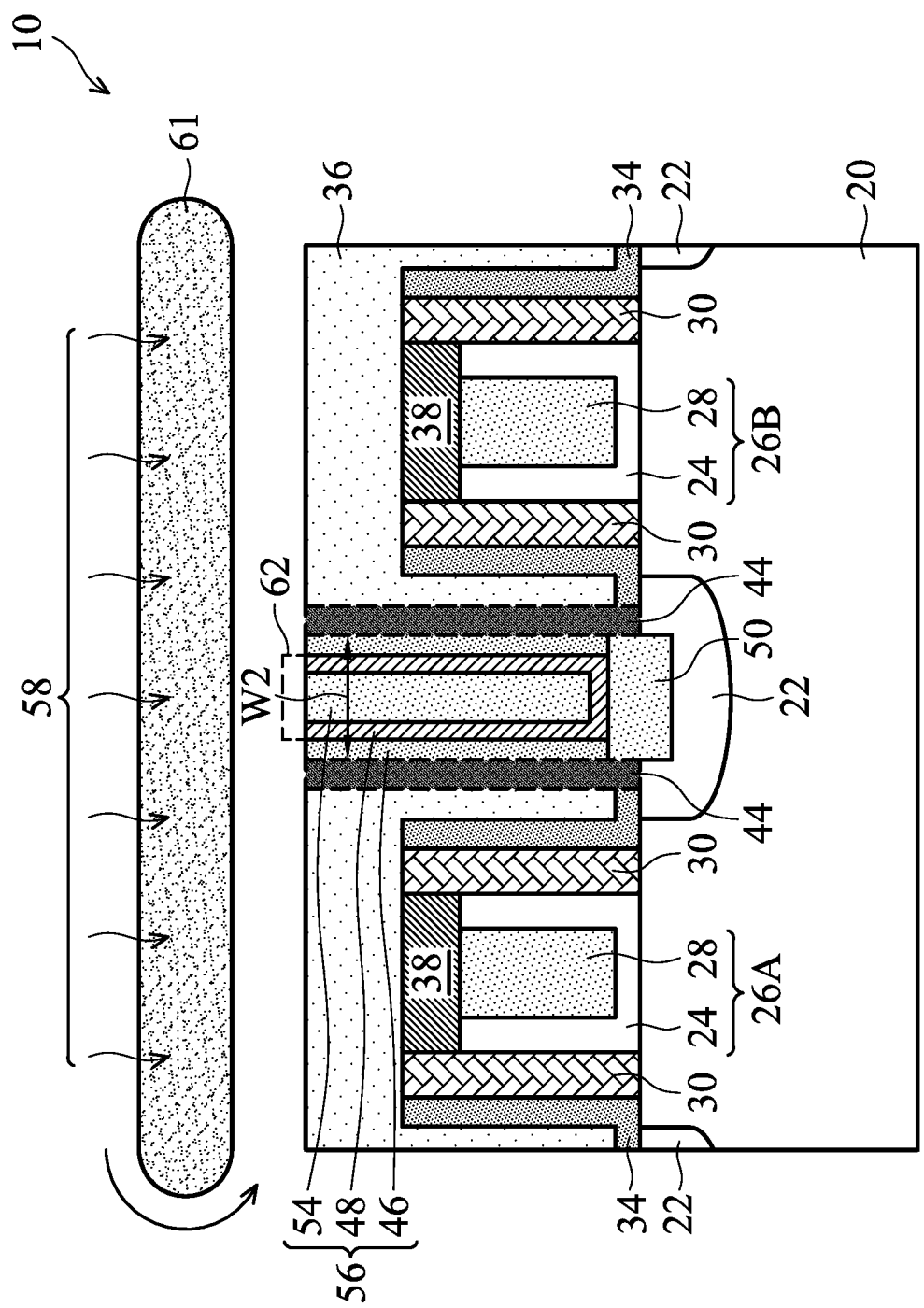

Next, as also shown in FIG. 7, a planarization process such as a Chemical Mechanical Polish (CMP) is performed to remove the excess portions of metallic material 54, capping layer 48, and metal layer 46 over ILD 36. Source/drain contact plug 56 is thus formed, as shown in FIG. 8. The respective step is illustrated as step 212 in the process flow shown in FIG. 15. FIG. 7 schematically illustrates polish pad 57. In an actually CMP process, polish pad 57 may have a size/diameter greater than the size of wafer 10. During the CMP process, polish pad 57 may face up, while wafer 10 may face down and is pressed against polish pad 57. Wafer 10 is rotated during the CMP. A slurry (not shown) is dispensed on polish pad 57 during the CMP.

After the CMP is finished, wafer 10 is cleaned in a cleaning step. The respective step is illustrated as step 214 in the process flow shown in FIG. 15. FIG. 8 schematically illustrates an exemplary cleaning process. Brush 61 may be used to brush wafer 10 during the cleaning to scrub off the fall-on, slurry, and the by-products generated during the CMP. In accordance with some embodiments of the present disclosure, brush 61 is a roller sponge brush, which rotates during the cleaning as illustrated. Brush 61 may also be a pencil brush. In an exemplary cleaning, a roller sponge brush may be used to brush wafer 10 first, followed by the cleaning using a pencil brush. When brush 61 is used to brush wafer 10, cleaning solution 58 is also applied on wafer 10, for example, through spray, so that the fall-on, slurry, and the by-products generated during the CMP may be removed. Brush 61 is in physical contact with wafer 10 during the cleaning. The cleaning may be performed for a period of time between about 1.5 minutes and about 2.5 minutes, with cleaning solution 58 being at a temperature between about 18° C. and about 21° C.

Figure 12:
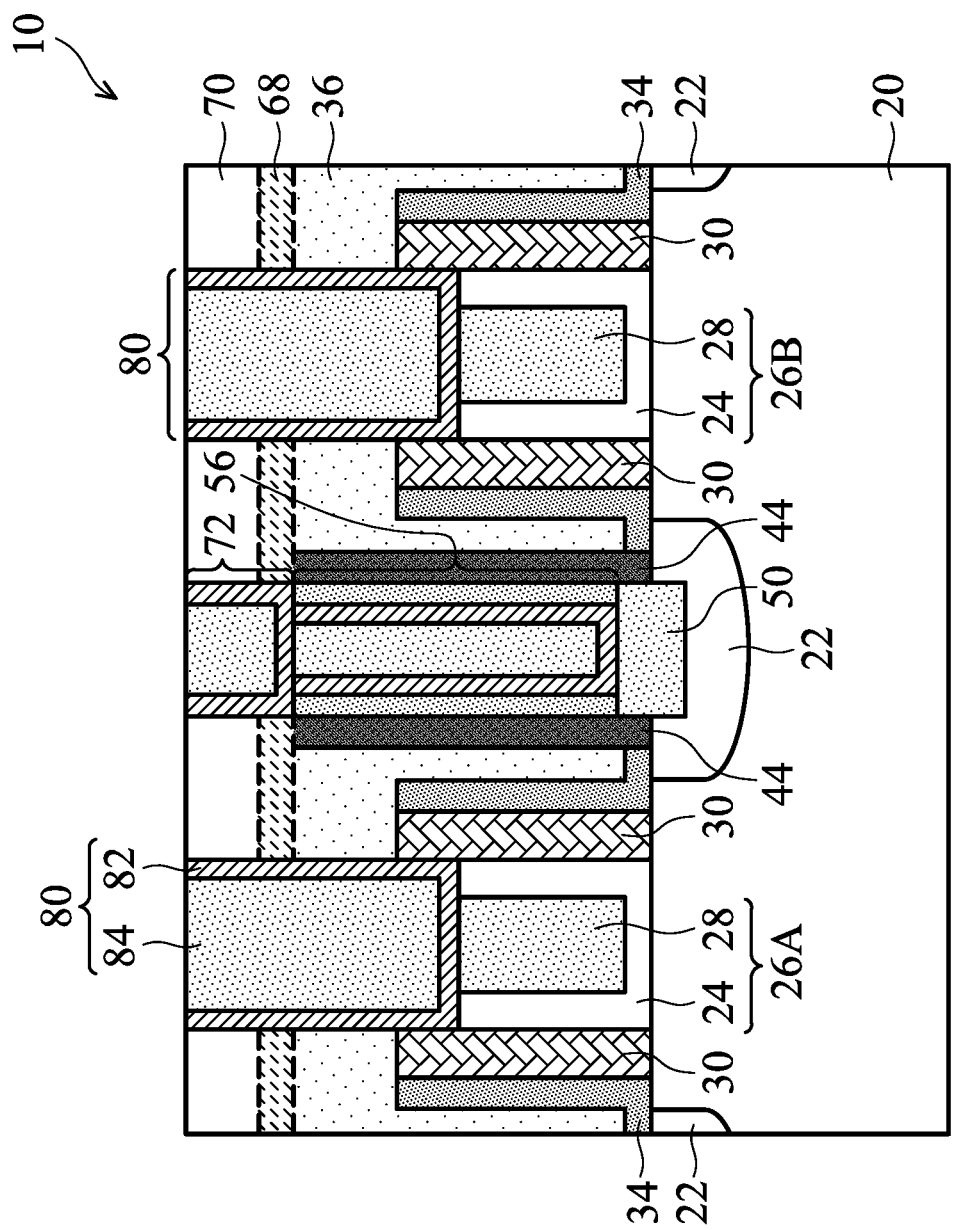

The cleaning environment may result in a galvanic electrode including contact plug 56 and the parts of wafer 10 electrically connected to contact plug 56, especially for NMOS transistors and N-Well regions. Accordingly, electrons may be conducted away from contact plug 56 into source/drain region 22. The metal such as tungsten, with the electrons lost to substrate 20, thus becomes metal ions with positive charges. The metal ions may be lost into the cleaning solution 58 in the resulting corrosion, resulting in metal loss and the recessing of contact plug 56. With the recessing, the top surface of contact plug 56 will be lower than the top surface of ILD 36. In the embodiments in which the width W2 of contact plug 56 is very small, for example, smaller than about 20 nm, the resulting recess is deep and narrow (with a high aspect ratio), and it is difficult to fully fill the recess with the subsequently formed overlying conductive features such as via or contact plug 72 as shown in FIG. 12. In accordance with some embodiments of the present disclosure, an inhibitor is used in cleaning solution 58 to reduce, and possibly eliminate, the recessing of contact plug 56 during the cleaning process.

It is understood that the desirable PH value of cleaning solution 58 is related to the material of contact plug 56, whose surface is to be cleaned. Different materials react differently to different types of clean solutions. Accordingly, in conventional processes, strong bases were used for the cleaning of copper after the respective CMP, while acid or neutral liquids were used for the cleaning of tungsten after the respective CMP. Tungsten, however, may be corroded/etched by acidic solutions. Also, even if a cleaning solution is neutral, which means its PH value is 7.0, the galvanic reaction occurs, and tungsten will also be corroded during the cleaning. In the conventional cleaning processes, acid and/or neutral cleaning solutions were used to clean tungsten plugs for some of their properties in response to tungsten. Acid and/or neutral cleaning solutions, however, also result in the corrosion of tungsten plugs. In conventional structures, the loss of tungsten caused by the cleaning did not post a problem. The reason is that the tungsten plugs in conventional structures were relatively wide, and the depths of the resulting recess caused by cleaning were relatively small compared to the widths of the tungsten plugs. Accordingly, the subsequently formed overlying conductive materials may easily fill the recess without causing open circuit. In newer generation of integrated circuits, however, the widths of tungsten plugs are very small, for example, may reach about 20 nm or smaller. The corrosion depths caused in the convention cleaning thus become comparable to, and sometimes greater than, the widths of contact plug 56, resulting in deep and narrow recesses. When overlying conductive features 72 (FIG. 12) such as contact plugs, vias, metal lines, etc. are formed, it is thus difficult to fully fill such a recess, and open circuit may be resulted.

In accordance with some embodiments of the present disclosure, an inhibitor is added into cleaning solution 58 (which contains water) to prevent the corrosion of tungsten plugs. In accordance with some embodiments of the present disclosure, the inhibitor is formed of organic amine, which may be, for example, $C_5H_{15}NO_2$. $C_5H_{15}NO_2$ has a molecular weight equal to 121.18. The inhibitor such as the organic amine causes the PH value in cleaning solution 58 to be basic/alkaline (with PH value higher than 7.0). This is different from conventional cleaning solutions used after the CMP of tungsten. The inhibitor in cleaning solution 58 is attached to the exposed surface of contact plug 56, wherein layer 62 is drawn to represent the attached inhibitor. The inhibitor is negatively charged. Layer 62 is a carbon-concentrated layer, and layer 62 protects the underlying contact plug from the recessing of the cleaning solution 58. As a result, the attached inhibitor 60 electrically cuts the path between cleaning solution 58 and contact plug 56, and electrons are prevented from being flowing into source/drain region 22, and positive tungsten ions are prevented from dissolving into cleaning solution 58. The corrosion is thus reduced.

The inhibitor in cleaning solution 58 functions well when the cleaning solution 58 is a weak base solution with PH values in the range between (not including) 7.0 and about 8.0. Alternatively stated, the PH value is greater than 7.0 and lower than about 8.0. In neutral or acidic environment, the inhibitor is unable to attach to the surface of contact plug 56, and corrosion will occur. On the other hand, if the PH value of cleaning solution 58 is increased to greater than about 8.0 or higher, the inhibitor also starts losing its inhibiting function increasingly, and tungsten will be corroded/etched by the respective strong base solutions. In accordance with some embodiments of the present disclosure, cleaning solution is adjusted to greater than 7.0 and lower than about 8.0 to allow the inhibitor to function.

In accordance with some embodiments of the present disclosure, the adjustment of the PH value of cleaning solution 58 is achieved by adjusting the concentration of the organic amine. For example, the concentration of the organic amine in cleaning solution 58 may be adjusted to between about 0.5 percent and about 2 percent. A buffer agent such as (hydroxymethyl) aminomethane (TRIS) or saline sodium citrate (SSC) may be added into cleaning solution 58, making cleaning solution 58 a buffer solution, so that its PH value may remain constant within the desirable range (between 7.0 and about 8.0). In accordance with some embodiments, other chemicals such as HCl may be added to adjust the PH value of cleaning solution 58.

Figure 9:
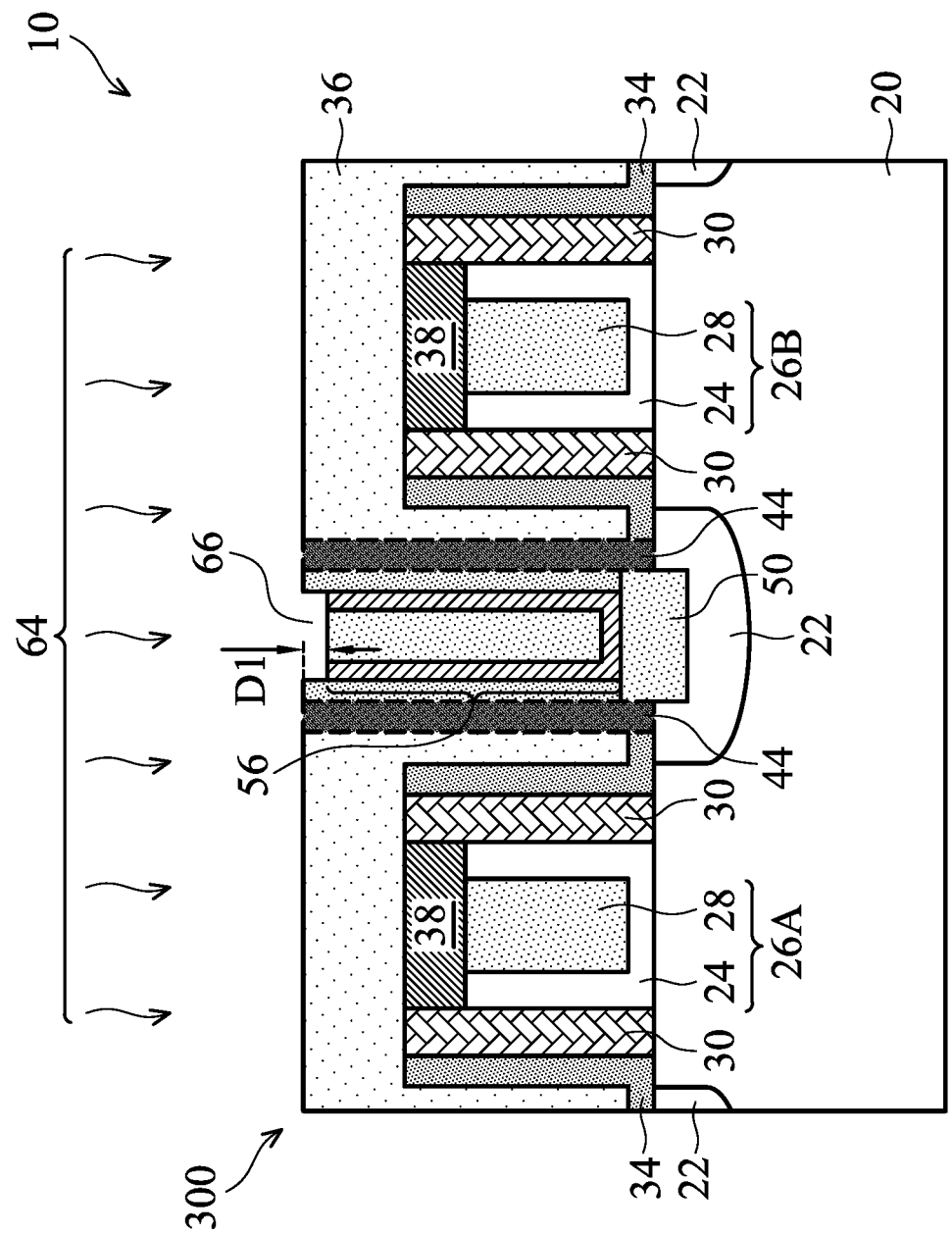

After the cleaning of wafer 10 using cleaning solution 58, the residue on wafer 10 is spun off and brushed off. Clean air 64 may be blown on wafer 10 to dry wafer 10, as shown in FIG. 9. The respective step is illustrated as step 216 in the process flow shown in FIG. 15. During the period of time starting from the time point the CMP is finished to the time point wafer 10 starts to be dried (or the time point wafer 10 is fully dried), no neutral cleaning solution or acidic solution is used to clean wafer 10. In addition, no strong base solution with PH value significantly higher than 8.0 (such as 8.5) is used. As a result, the corrosion of contact plug 56 is minimized. FIG. 9 illustrates a resulting wafer 10, with recess 66 (if formed by the cleaning step) being illustrated schematically. By performing the cleaning using the methods in accordance with the embodiments of the present disclosure, recess depth D1 of recess 66 may be smaller than about 50 Å due to the reduced corrosion. If contact plug 56 has a portion protruding over the top surfaces of ILD 36 before the cleaning, the top surface of contact plug 56 may also be coplanar with the top surface of ILD 36 or higher than the top surface of ILD 36 after the cleaning.

Figure 10:
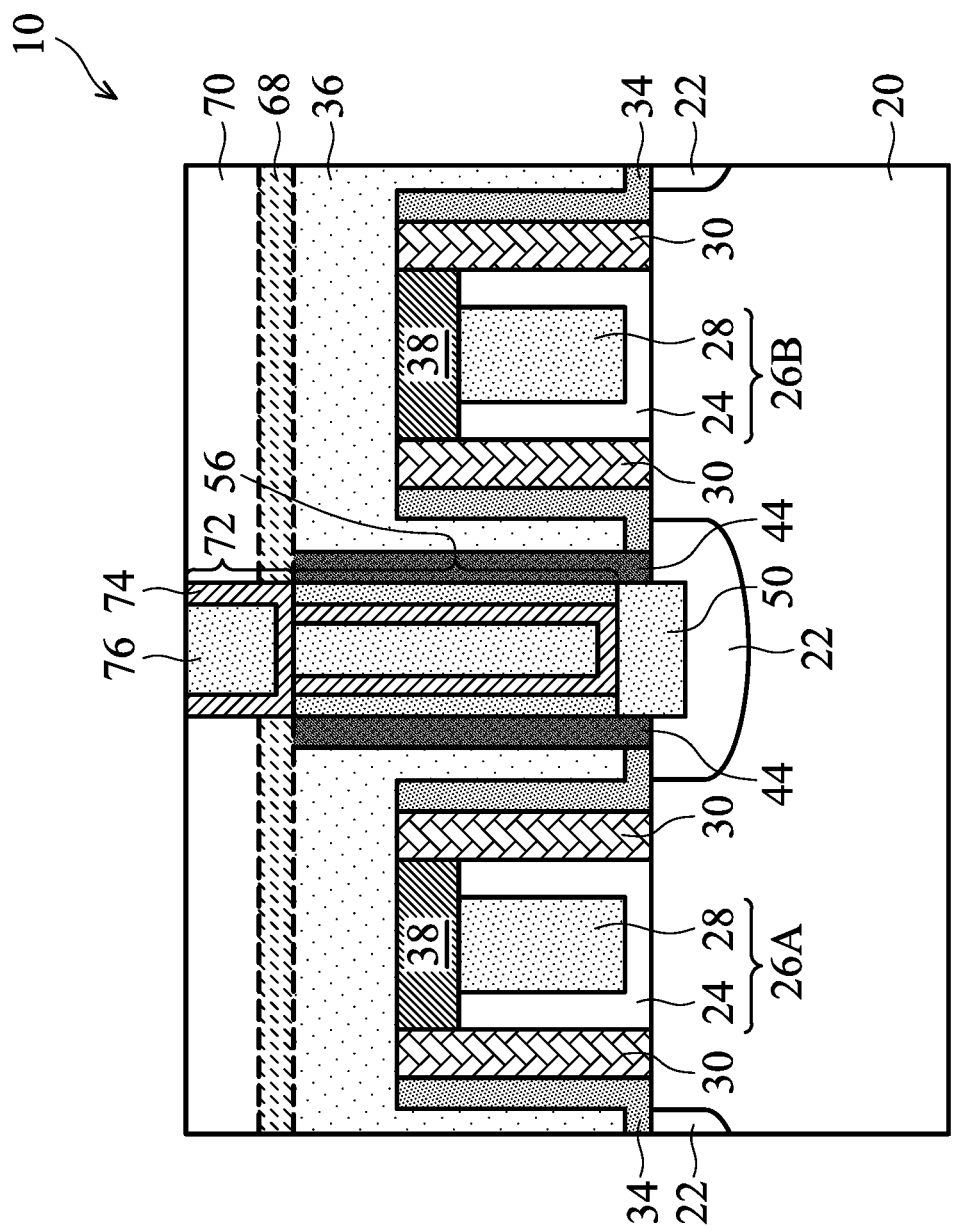

In the steps as shown in FIGS. 1 through 9, transistor 300 is formed. Referring to FIG. 10, etch stop layer 68 is formed in accordance with some embodiments of the present disclosure, followed by the formation of dielectric layer 70. In accordance with some embodiments, dielectric layer 70 is an inter-layer dielectric, and hence is alternately referred to as ILD1 70. Etch stop layer 68 may also be omitted in accordance with some embodiments. Accordingly, etch stop layer 68 is illustrated using dashed lines to indicate it may or may not be formed. Etch stop layer 68 may be formed of silicon carbide, silicon oxynitride, silicon carbo-nitride, combinations thereof, or composite layers thereof. Etch stop layer 68 may be formed using a deposition method such as CVD, Plasma Enhanced Chemical Vapor Deposition (PECVD), ALD, or the like. ILD1 70 may include a material selected from PSG, BSG, BPSG, Fluorine-doped Silicon Glass (FSG), or TEOS. ILD1 70 may also be formed of a non-porous low-k dielectric material, which may be a carbon-containing dielectric material. ILD1 70 may be formed using spin coating, FCVD, or the like, or may be formed using a deposition method such as CVD, PECVD, Low Pressure Chemical Vapor Deposition (LPCVD), or the like.

FIG. 10 further illustrates the formation of conductive feature 72. The formation of layers 68 and 70 and conductive feature 72 is illustrated as step 218 in the process flow shown in FIG. 15. In accordance with some embodiments of the present disclosure, conductive feature 72 is a contact plug, and the etch stop layer 68 as shown in FIG. 10 is not formed. In accordance with alternative embodiments, conductive feature 72 is a copper via or a copper line, and etch stop layer 68 is formed in accordance with these embodiments.

The formation of conductive feature 72 may include forming an opening in dielectric layers 68 and 70 to expose contact plug 56, filling a conductive material(s) in the opening, and performing a planarization. Conductive feature 72 may include conductive adhesion/barrier layers 74, and metallic material 76 over adhesion/barrier layers 74. Adhesion/barrier layer 74 may be formed of a material selected from titanium, titanium nitride, tantalum, tantalum nitride, combinations thereof, or multi-layers thereof. Metallic material 76 may be formed of tungsten, copper, aluminum, or alloys thereof, and may be formed using PVD, Metal-Organic Chemical Vapor Deposition (MOCVD) or plating. Advantageously, if recess 66 in FIG. 9 is formed due to the cleaning process, since recess 66 is shallow in accordance with the embodiments of the present disclosure, conductive feature 72 may easily be filled into recess 66 without generating open circuit.

Figure 11:
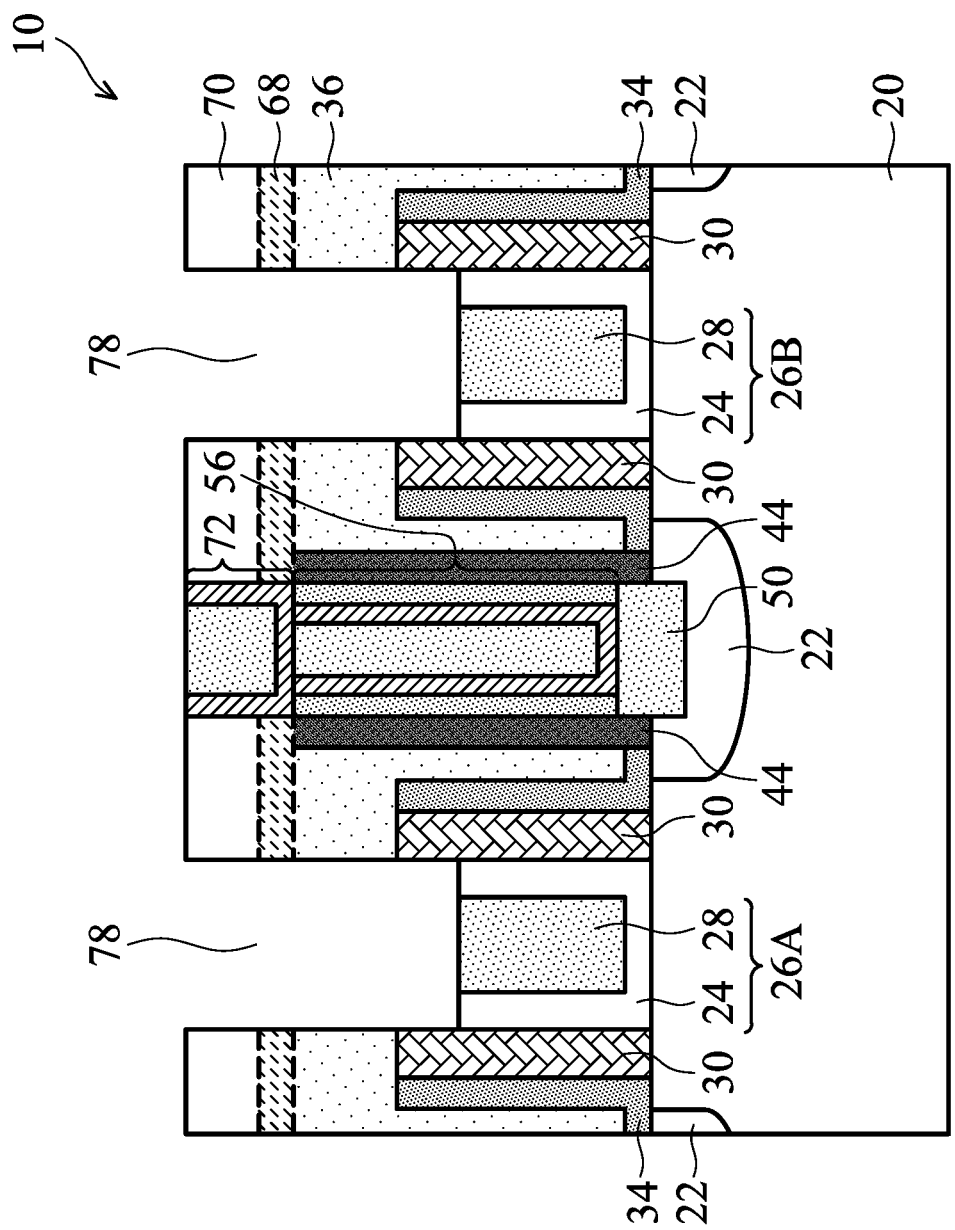

FIGS. 11 and 12 illustrate the formation of gate contact plugs. The respective step is illustrated as step 220 in the process flow shown in FIG. 15. An etching process(es) is performed to etch dielectric layer 70, etch stop layer 68, ILD 36 and mask layers 38 (FIG. 10), so that gate contact openings 78 are formed, as shown in FIG. 11. Next, contact openings 78 are filled with a conductive material(s) to form gate contact plugs 80, as shown in FIG. 12. In accordance with some embodiments of the present disclosure, gate contact plugs 80 include conductive adhesion/barrier layers 82, and metallic material 84 over adhesion/barrier layers 82. The adhesion/barrier layer 82 may be formed of a material selected from titanium, titanium nitride, tantalum, tantalum nitride, combinations thereof, or multi-layers thereof. Metallic material 84 may be formed of tungsten, copper, aluminum, or alloys thereof.

Figure 13:
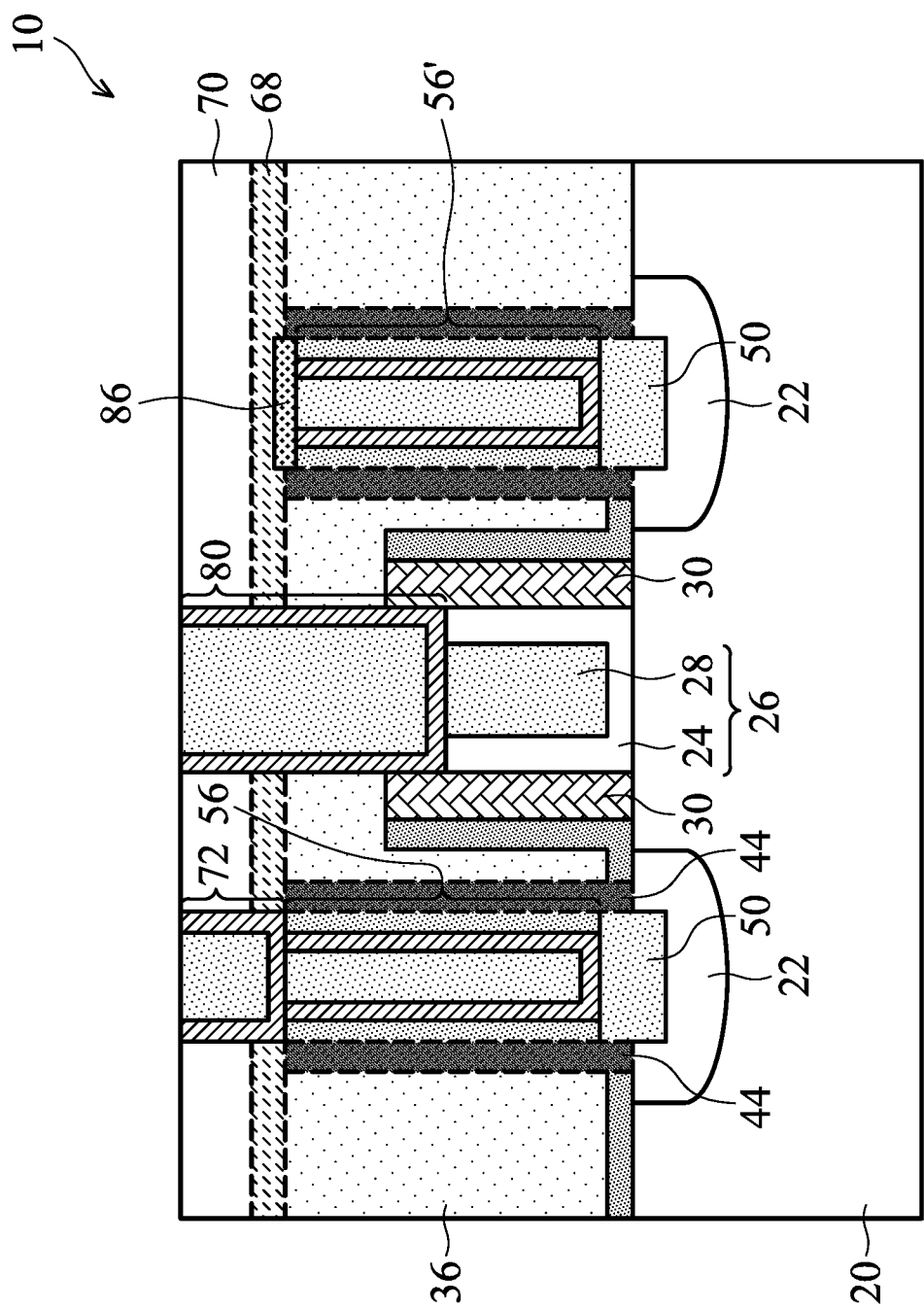
FIG. 13 illustrates a cross-sectional view of a contact plug with a carbon-rich layer left on top of a contact plug.

FIG. 13 illustrates carbon-rich layer 86 left on some portions of contact plug 88, wherein carbon-rich layer 86 includes the attached inhibitor 62 (FIG. 8) mixed with the overlying and underlying materials. In accordance with some embodiments, contact plug 56' is on the same die/wafer as contact plug 56, and is formed simultaneously as contact plug 56. It is noted that although contact plug 56' is drawn to be close to gate stack 26, contact plug 56' may actually be spaced apart from gate stacks. Contact plug 56' has no overlying via or contact plug connecting to it, and carbon-rich layer 86 is formed on contact plug 56' and left in the final structure. Carbon-rich layer 86 may include a mix of the residue organic amine, which is the attached inhibitor 62 in FIG. 8. Carbon-rich layer 86 may also include the material of contact plug 56' and/or the material of etch stop layer 68 or dielectric 70 (when layer 68 is not formed). Carbon-rich layer 86 has a higher carbon concentration than the underlying contact plug 56'. The carbon percentage in carbon-rich layer 86 may also be higher than that in the overlying dielectric 68 (or 70). In accordance with some embodiments, the atomic percentage of carbon in carbon-rich layer 86 is higher than the atomic percent of carbon in contact plugs 56' and overlying layer 68 (or layer 70 if layer 68 is not formed) by 15 percent or higher. It is realized that although ILD 36 is also exposed to cleaning solution 58 (FIG. 8) during the cleaning, since tungsten tends to carry positive charges, and the inhibitor in the cleaning solution 58 and ILD 36 tends to be negatively charged, the inhibitor tends to accumulate on the top surface of contact plugs 56' and 56, but not on the top surface of ILD 36. Accordingly, in the structure as shown in FIG. 13, there is a carbon-rich layer 86 on the top surface of contact plug 56', but not on the top surface of ILD 36.

The carbon-rich layer 86 may exist on all top surfaces of contact plugs 56' and 56 at a time immediately after the cleaning process. As long as these surfaces are not exposed again after the formation of layers 68/70, the corresponding carbon-rich layer will be preserved. For example, if the conductive feature 72 is narrower than the underlying contact plug 56, in the formation of the opening for filling conductive feature 72, some top surface portions of contact plug 56 may not be exposed. Accordingly, these surface portions of contact plug 56 will also have carbon-rich layers over and contacting them.

Figure 14:
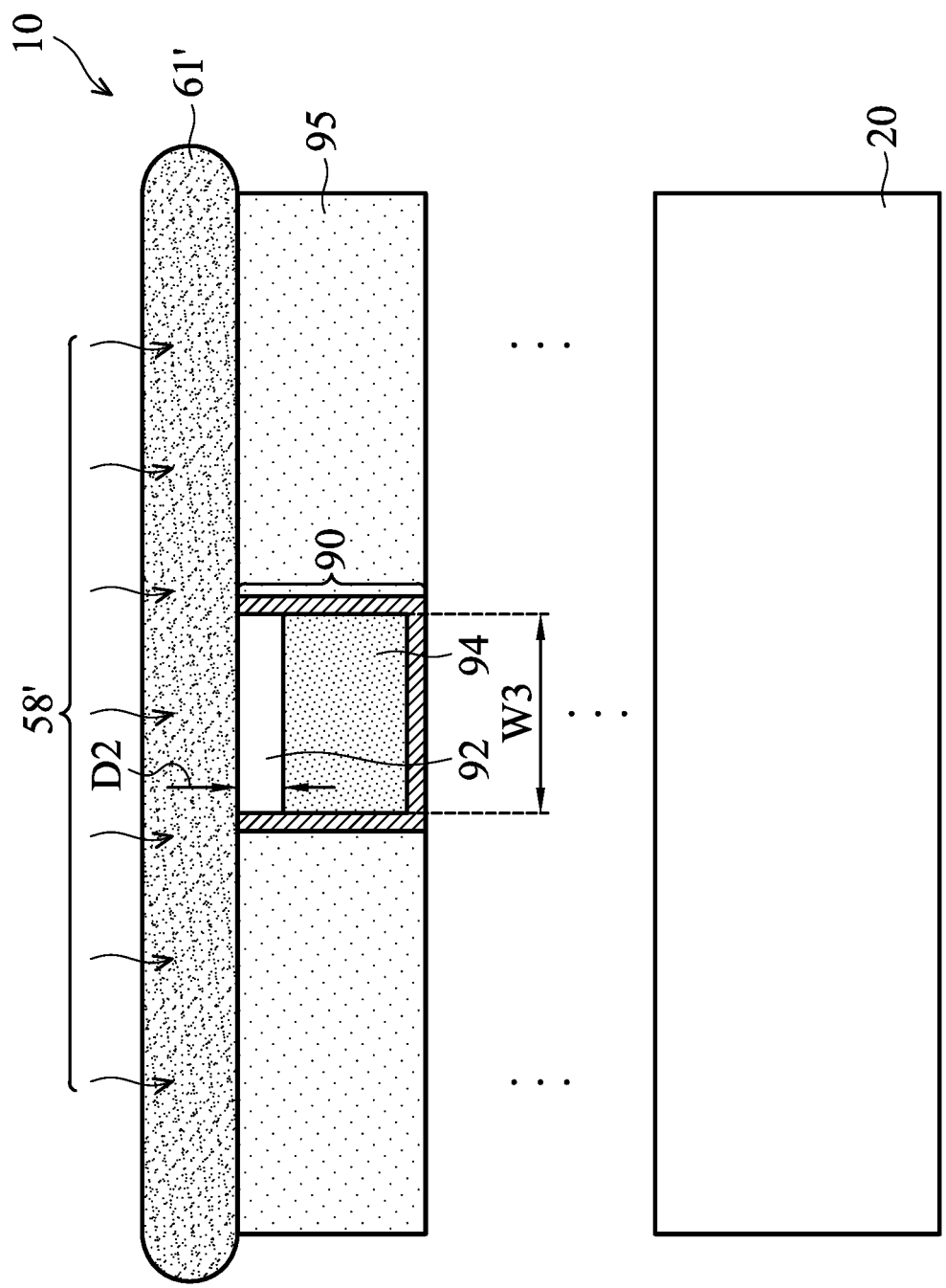
FIG. 14 illustrates the cleaning performed on an additional metallic feature using an acid solution or a neutral liquid.

FIG. 14 illustrates the cleaning of conductive feature 90, which is formed on the same wafer as contact plug 56. Conductive feature 90 may be formed of a similar metal as contact plug 56, and may be formed of tungsten. In accordance with some embodiments, conductive feature 90 is a gate electrode (such as 28 in FIG. 1), a contact plug, a metal pad, or a redistribution line. Conductive feature 90 has width W3 greater than the width W2 (FIG. 8 of contact plug 56. The formation of conductive feature 90 includes forming an opening (filled by conductive feature 90) in dielectric layer 95, filling a metallic material 94, which may include tungsten, and performing a CMP. After the CMP, a cleaning is performed using brush 61' and cleaning solution 58'. In accordance with some embodiments of the present disclosure, cleaning solution 58' comprises an organic acid, which may include a citrus acid ($C_6H_8O_7$). The cleaning may also be performed using a neutral liquid (also represented by 58') such as de-ionized water. In accordance with some embodiments, the recess 92 formed due to the corrosion has depth D2 greater than about 100 Å. Although this depth has a greater value than depth D1 (FIG. 9), since width W3 of conductive feature 90 is much greater than width W2 (for example, ration W3/W2 may be 2.0 or greater), the gap filling of recess 92 has no problem, and no open circuit will be generated. Accordingly, in accordance with the present disclosure, the cleaning solutions may be selected according to the widths of the respective cleaned features. For example, when forming the wafer, a threshold width is pre-determined, for example, through experiment based on whether the recesses 66 (FIG. 9) can be filled without generating defect or not. The threshold width may be 50 nm, for example, and is determined by a plurality of factors. In the cleaning of all tungsten-containing features having widths greater than the threshold width, acidic solutions and/or neutral liquids/solutions are used, while in the cleaning of all tungsten-containing features having widths equal to or smaller than the threshold width, weak base solutions as discussed above are used.

The embodiments of the present disclosure have some advantageous features. By adopting an inhibitor in the cleaning solution for cleaning the wafer, the contact plug is protected from the corrosion caused by the cleaning solution, and the contact loss is reduced. Furthermore, by adjusting the PH values of the inhibitor, the respective chemical (such as the organic amine) may function as an inhibitor during the cleaning performed after CMP.

In accordance with some embodiments of the present disclosure, a method includes forming a first dielectric layer over a wafer, etching the first dielectric layer to form an opening, filling a tungsten-containing material into the opening, and performing a CMP on the wafer. After the CMP, a cleaning is performed on the wafer using a weak base solution.

In accordance with some embodiments of the present disclosure, a method includes forming an ILD with a portion at a same level as a gate stack of a transistor, The ILD and the gate stack are parts of a wafer. The ILD is etched to form a source/drain contact opening. A source/drain region of the transistor is exposed through the source/drain contact opening. A tungsten-containing material is deposited on the wafer, wherein the tungsten-containing material has a portion filling the source/drain contact opening. A CMP is performed on the wafer to remove excess portions of the tungsten-containing material. The wafer is then cleaned using a cleaning solution including organic amine, wherein the cleaning solution is a weak base solution. The wafer is then dried.

In accordance with some embodiments of the present disclosure, a structure includes a first dielectric layer, and a metal plug in the first dielectric layer. A top surface of the metal plug is substantially coplanar with a top surface of the first dielectric layer. A carbon-rich layer is overlying and contacting the metal plug. The carbon-rich layer has a first carbon concentration higher than a second carbon concentration of the metal plug. A second dielectric layer is overlying and contacting the carbon-rich layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
    a first dielectric layer;
    a first contact plug in the first dielectric layer;
    a second contact plug in the first dielectric layer;
    a third contact plug overlying and contacting the first contact plug;
    a carbon-rich layer overlying and contacting the second contact plug, wherein the carbon-rich layer has a first carbon concentration higher than a second carbon concentration of the first contact plug, and wherein the carbon-rich layer comprises organic amine; and
    a second dielectric layer over and contacting the carbon-rich layer.

2. The structure of claim 1, wherein the second dielectric layer comprises:
    an etch stop layer over and contacting the carbon-rich layer; and
    an inter-layer dielectric over the etch stop layer, wherein the third contact plug extends into both of the etch stop layer and the second dielectric layer.

3. The structure of claim 1, wherein the carbon-rich layer comprises first opposing edges flush with respective second opposing edges of the second contact plug.

4. The structure of claim 1 further comprising:
    a first source/drain region underlying and electrically coupling to the first contact plug; and
    a second source/drain region underlying and electrically coupling to the second contact plug.

5. The structure of claim 1, wherein the first carbon concentration is higher than a third carbon concentration of a bottom portion of the second dielectric layer, with the bottom portion contacting the carbon-rich layer.

6. The structure of claim 5, wherein the first carbon concentration is higher than both of the second carbon concentration and the third carbon concentration by differences greater than about 15 percent.

7. The structure of claim 1, wherein the carbon-rich layer comprises organic amine mixed with materials of the second dielectric layer.

8. The structure of claim 1 further comprising a dielectric contact spacer encircling and contacting the second contact plug, wherein side edges of the carbon-rich layer are flush with side edges of the dielectric contact spacer.

9. A structure comprising:
a semiconductor region;
a first source/drain region and a second source/drain region extending into the semiconductor region;
a first inter-layer dielectric over the first source/drain region and the second source/drain region;
a first metal plug and a second metal plug in the first inter-layer dielectric, wherein the first metal plug and the second metal plug comprise a first top surface and a second top surface, respectively;
a carbon-free feature over and contacting the first top surface;
a carbon-rich layer over and contacting the second top surface; and
an etch stop layer over and contacting both of the carbon-rich layer and the first inter-layer dielectric, wherein the carbon-rich layer has a first carbon concentration higher than a second carbon concentration of the etch stop layer, and wherein no carbon-rich layer having carbon concentrations higher than both of the second carbon concentration and a third carbon concentration of the first inter-layer dielectric exists between the first inter-layer dielectric and the etch stop layer.

10. The structure of claim 9, wherein the first carbon concentration is further higher than the third carbon concentration of the first inter-layer dielectric.

11. The structure of claim 9 further comprising:
a second inter-layer dielectric over and contacting the etch stop layer, wherein the first carbon concentration is further higher than a fourth carbon concentration of the second inter-layer dielectric.

12. The structure of claim 9, wherein the carbon-rich layer comprises a first edge, and the second metal plug comprises a second edge flush with the first edge.

13. The structure of claim 9, wherein the carbon-rich layer comprises organic amine.

14. The structure of claim 9, wherein the carbon-free feature comprises a third metal plug.

15. A structure comprising:
a semiconductor region;
a gate stack over the semiconductor region;
a first source/drain region and a second source/drain region on opposing sides of the gate stack and extending into the semiconductor region;
a first source/drain contact plug and a second source/drain contact plug over the first source/drain region and the second source/drain region, respectively;
a conductive feature over and contacting a first top surface of the first source/drain contact plug; and
a dielectric layer over and contacting a second top surface of the second source/drain contact plug, wherein the dielectric layer comprises organic amine.

16. The structure of claim 15, wherein the conductive feature comprises a contact plug.

17. The structure of claim 15 further comprising an etch stop layer over the first source/drain contact plug and the second source/drain contact plug, wherein the dielectric layer further comprises materials of the etch stop layer.

18. The structure of claim 15 further comprising a dielectric material on opposing sides of, and contacting, the second source/drain contact plug, wherein the dielectric layer has an edge flushed with an edge of the dielectric material.

19. The structure of claim 18, wherein the dielectric material comprises a dielectric contact spacer encircling the second source/drain contact plug.

* * * * *